United States Patent [19]
Nakai et al.

[11] Patent Number: 5,444,277
[45] Date of Patent: Aug. 22, 1995

[54] SOLID IMAGING PICK-UP ELEMENT

[75] Inventors: Junichi Nakai; Yasuhiro Imanaka; Tetsuro Aoki; Shouichi Ishibe, all of Fukuyama; Tooru Watanabe, Nara, all of Japan

[73] Assignee: Sharp Kabushiki Kaisha, Osaka, Japan

[21] Appl. No.: 275,072

[22] Filed: Jul. 13, 1994

Related U.S. Application Data

[63] Continuation of Ser. No. 913,686, Jul. 14, 1992, abandoned.

[30] Foreign Application Priority Data

Jul. 15, 1991 [JP] Japan .................. 3-174169

[51] Int. Cl.⁶ .................. H01L 27/14; G02F 1/015
[52] U.S. Cl. .................. 257/223; 257/229; 257/294; 257/432
[58] Field of Search .............. 257/222, 223, 291, 292, 257/294, 233, 232, 435, 443, 432, 229

[56] References Cited

U.S. PATENT DOCUMENTS

| | | | |
|---|---|---|---|
| 4,210,922 | 7/1980 | Shannon | 257/222 |
| 4,464,684 | 8/1984 | Esser et al. | 257/222 |
| 4,783,691 | 11/1980 | Harada | 257/435 |
| 5,192,990 | 3/1993 | Stevens | 257/222 |

FOREIGN PATENT DOCUMENTS

| | | | |
|---|---|---|---|
| 1270362 | 10/1980 | Japan | 257/432 |
| 62-81753 | 4/1987 | Japan | 257/215 |
| 2-137235 | 5/1990 | Japan | 257/215 |
| 2-84348 | 6/1990 | Japan | 257/215 |
| 2-246158 | 10/1990 | Japan | 257/215 |
| 2285673 | 11/1990 | Japan | 257/433 |
| 2-312274 | 12/1990 | Japan | 257/215 |
| 3194970 | 8/1991 | Japan | 257/229 |

OTHER PUBLICATIONS

J. Hojo et al., *IEEE Transactions on Electron Devices*, 38:(5) 954–959 (May, 1991), "A ⅔-in 510(H)×492(V) CCD Image Sensor with Mirror Image Function".

*Primary Examiner*—William Mintel
*Assistant Examiner*—Minhloan Tran
*Attorney, Agent, or Firm*—David G. Conlin; Kevin J. Fournier

[57] ABSTRACT

A solid image pick-up element has a pixel region, an output region located near the pixel region, and a field portion located remote from the pixel region, all of which are formed at un upper layer of a semiconductor substrate. The pixel region is provided with plural rows of light receiving portions for performing photoelectric conversion with respect to light received thereby. Between the plural rows of the light receiving portions are interposed transfer portions for transferring signals obtained through the photoelectric conversion. The output region is provided with an output portion for outputting the signals transferred from the transfer portions. The semiconductor substrate is covered with three dielectric films, and an opening is formed through two dielectric films at a location above the output portion.

12 Claims, 2 Drawing Sheets

SOLID IMAGING PICK-UP ELEMENT

This is a continuation of application Ser. No. 07/913,686 filed Jul. 14, 1992, now abandoned.

BACKGROUND OF THE INVENTION

FIELD OF THE INVENTION

The present invention relates to a solid image pick-up element employing, for example, CCDs (charge coupled devices). The solid image pick-up element is preferably used in an area sensor, a line sensor or the like.

DESCRIPTION OF THE PRIOR ART

FIG. 1 depicts a conventional solid image pick-up element having a pixel region 113, an output region 112 located in the proximity of the pixel region 113, and a field portion 111 located remote from the pixel region 113. All the pixel region 113, the output region 112, and the field portion 111 are formed at an upper layer of a semiconductor substrate 101. The pixel region 113 is provided with a number of light receiving portions 104 having a photoelectric conversion function and a number of transfer portions 103 for transferring electric signals obtained through photoelectric conversion. The light receiving portions 104 and the transfer portions 103 are disposed alternately. The output region 112 is provided with an output portion 102 for outputting signals transferred from the transfer portions 103. The field portion 111 is provided with a pad portion 107. The semiconductor substrate 101 having the above-described structure is entirely covered with a BPSG (boron phosphorus silicate glass) film 105 in which B (boron) and P (phosphorus) are added to $SiO_2$. The entire surface of the BPSG film 105 except an upper portion of the pad portion 107 is covered with a PSG (phosphorus silicate glass) film 106 in which P (phosphorus) is added to $SiO_2$. The pad portion 107 is formed directly on the BPSG film 105.

The recent trend in design of solid image pick-up elements is to reduce the size thereof and to increase the number of pixels. With this trend, there is an increasing demand toward high sensitivity. The following two methods are conventionally known to enhance the sensitivity:

(1) a method in which the area of light receiving portions is enlarged to increase the amount of incident light, thereby increasing the quantity of signals (the quantity of electric charges) which are subjected to photoelectric conversion in the light receiving portions; and (2) another method in which the capacity of a detection portion provided in an output portion is reduced to enhance the electric charge-to-voltage conversion efficiency, thereby effectively converting signals (electric charges) obtained through the photoelectric conversion in the light receiving portions to an output voltage.

FIG. 2 depicts a solid image pick-up element employing the method (1). The solid image pick-up element shown in FIG. 2 has the same structure as that shown in FIG. 1 and further has a polymeric resin film 108 formed on the PSG film 106, a color filter 109 formed on the polymeric resin film 108, and a number of very tiny lenses 110 formed on the color filter 109. The lenses 110 act to increase the amount of incident light entering the light receiving portions 104, thereby increasing the quantity of signals which are subjected to photoelectric conversion in the light receiving portions 104.

On the other hand, the method (2) is carried out, for example, by reducing the area of a detection diode provided in the output portion 102 or by shortening the wiring length between the detection diode and a driver gate provided in the output portion 102 at the first stage thereof. By doing so, the capacity of the detection portion of the output portion 102 is reduced, thereby enhancing the electric charge-to-voltage conversion efficiency.

These methods, however, cannot enhance the sensitivity of solid image pick-up elements to a sufficiently high level. Further enhancement of the sensitivity requires considerable changes in production processes or requires new materials or devices. As a result, the production cost of the solid image pick-up elements increases.

SUMMARY OF THE INVENTION

The present invention has been developed to overcome the above-described disadvantages.

It is accordingly an object of the present invention to provide an improved solid image pick-up element having a sufficiently high sensitivity which can be readily manufactured without increasing the production cost.

In accomplishing the above and other objects, a solid image pick-up element according to the present invention comprises a semiconductor substrate, a plurality of light receiving portions for performing photoelectric conversion with respect to light received thereby, a plurality of transfer portions for transferring signals obtained through the photoelectric conversion, and an output portion for outputting the signals transferred from the transfer portions. All the light receiving portions, the transfer portions, and the output portion are formed on the semiconductor substrate. The solid image pick-up element according to the present invention further comprises at least one dielectric film covered on the semiconductor substrate and having an opening formed at a location above the output portion.

Preferably, the dielectric film is made of polymeric resin.

Advantageously, the size and configuration of the opening are substantially the same as those of an upper surface of the output portion.

The provision of the opening above the output portion reduces the capacity of a detection portion of the output portion, thereby enhancing the electric charge-to voltage conversion efficiency.

BRIEF DESCRIPTION OF THE DRAWINGS

The above and other objects and features of the present invention will become more apparent from the following description of a preferred embodiment thereof with reference to the accompanying drawings, throughout which like parts are designated by like reference numerals, and wherein.

DETAILED DESCRIPTION OF THE PREFERRED EMBODIMENTS

Figure 3:
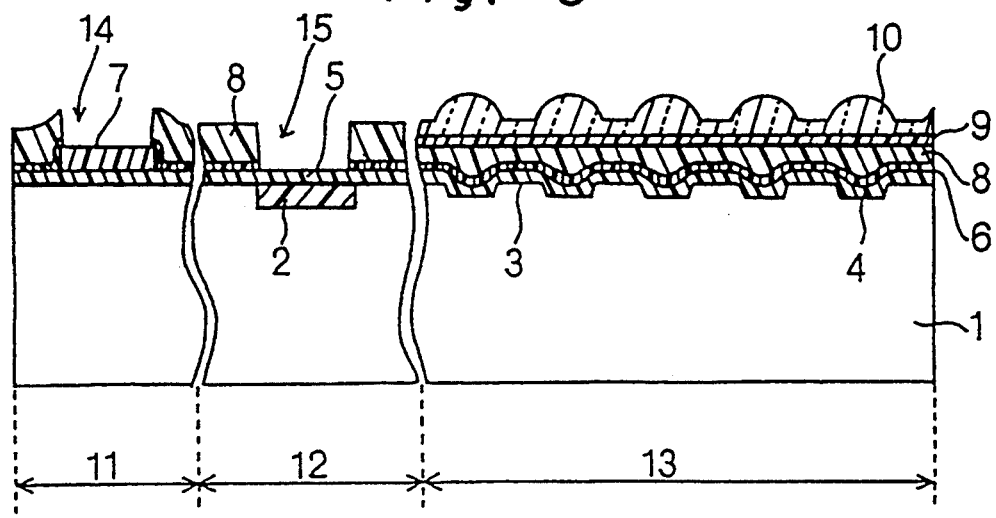
FIG. 3 is a view similar to FIG. 1, but indicating a solid image pick-up element according to the present invention.

FIG. 3 depicts a solid image pick-up element embodying the present invention. As shown in FIG. 3, the solid image pick-up element has a pixel region 13, an output region 12 located in the proximity of the pixel region 13, and a field portion 11 located remote from the pixel region 13. All the pixel region 13, the output region 12, and the field portion 11 are formed at an upper layer of a semiconductor substrate 1. The pixel region 13 is provided with plural rows of light receiving portions 4, which comprise a number of photodiodes having a photoelectric conversion function. Between the plural rows of the light receiving portions 4 are interposed transfer portions 3 comprising CCDs for transferring electric signals obtained through photoelectric conversion in the light receiving portions 4. The output region 12 is provided with an output portion 2 for outputting signals transferred from the transfer portions 3. The field portion 11 is provided with a pad portion 7. The semiconductor substrate 1 having the above-described structure is entirely covered with a first dielectric film 5 comprising BPSG in which B (boron) and P (phosphorus) are added to, for example, $SiO_2$. It is to be noted that the material of the first dielectric film 5 is not limited to BPSG, and Si compound such as, for example, $SiO_2$ or $Si_3N_4$ may be used as the material of the first dielectric film 5. The pad portion 7 is formed directly on the first dielectric film 5. The entire surface of the first dielectric film 5, except an upper portion of the pad portion 7 and a specific location above the output portion 2, is covered with a second dielectric film 6 comprising PSG in which P (phosphorus) is added to, for example, $SiO_2$. The second dielectric film 6 is entirely covered with a third dielectric film 8 made of polymeric resin such as acrylic resin, polyimide resin or the like. Two openings 14 and 15 are formed through the second and third dielectric films 6 and 8. The opening 14 is positioned above the pad portion 7, whereas the opening 15 is positioned above the output portion 2.

These openings 14 and 15 are formed, for example, by generally available plasma-etching after the second and third dielectric films 6 and 8 have been formed on the entire surface of the semiconductor substrate 1. Particularly, the size and configuration of the opening 15 formed above the output portion 2 are rendered to be substantially the same as those of the upper surface of the output portion 2.

It is to be noted that the material of the second dielectric film 6 is not limited to PSG, and Si compound such as, for example, $SiO_2$ or $Si_3N_4$ may be used as the material of the first dielectric film 5. Also, the material of the third dielectric film 8 is not limited to acrylic resin or polyimide resin, and any other suitable polymeric resin may be used.

At an upper portion of the pixel region 13, a color filter 9 is formed on the third dielectric film 8, and a number of very tiny lenses 10 made of transparent resin or the like are formed on the color filter 9.

Figure 1:
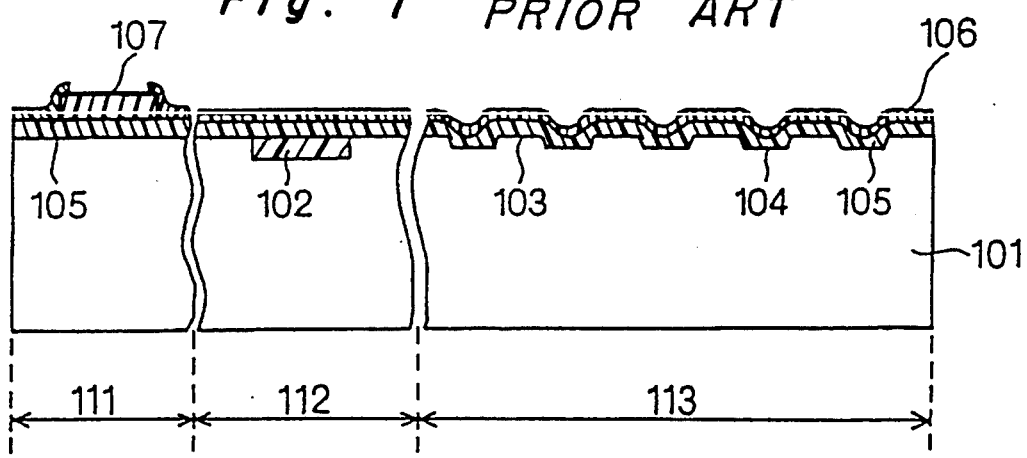
FIG. 1 is a cross-sectional view of a conventional solid image pick-up element.
Figure 2:
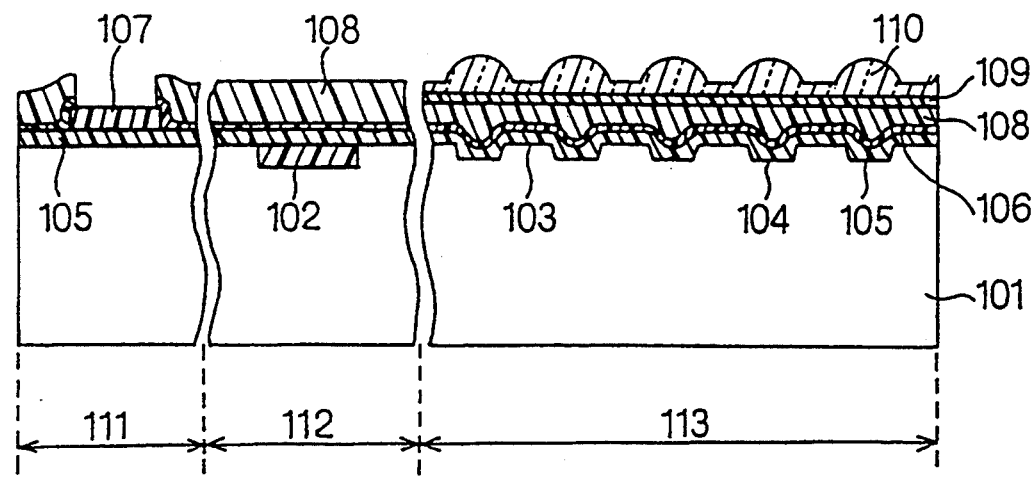
FIG. 2 is a view similar to FIG. 1, but indicating another conventional solid image pick-up element.

In the solid image pick-up element having the above-described structure, because neither the second dielectric film 6 nor the third dielectric film 8 exists above the output portion 2, the capacity of the detection portion of the output portion 2 reduces, thereby enhancing the electric charge-to-voltage conversion efficiency. Furthermore, the provision of the lenses 10 above the light receiving portions 4 increases the quantity of signals which are subjected to photoelectric conversion. As a result, the solid image pick-up element according to the present invention is rendered to have a sensitivity 20% higher than that of the conventional solid image pick-up element shown in FIG. 2. In addition, because the solid image pick-up element according to the present invention causes no considerable changes in production processes or requires no new materials or devices, the production cost thereof does not increase. In view of reliability or the production cost, Si compound such as, for example, $SiO_2$ or $Si_3N_4$ is preferably used as the material of the first and second dielectric films 5 and 6 whereas polymeric resin is preferably used as the material of the third dielectric film 8.

Figure 4:
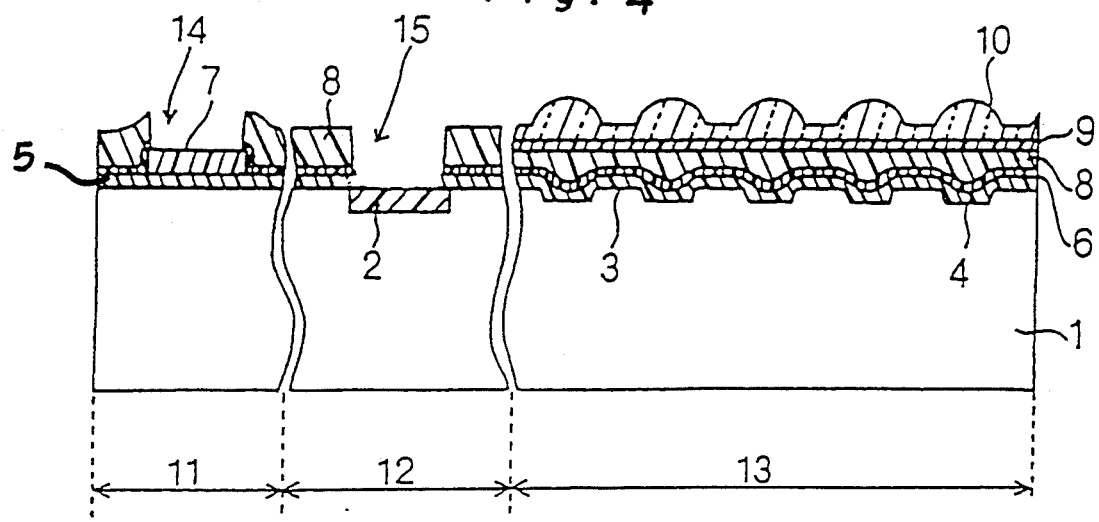
FIG. 4 also illustrates a solid image pick-up element according to the present invention.

In the above-described embodiment, although an opening 15 is formed through the second and third dielectric films 6 and 8 and above the output portion 2, this opening 15 may be formed through all the three dielectric films 5, 6, and 8. See FIG. 4 which shows such an opening 15 through all the dielectric films 5, 6 and 8. By doing so, the sensitivity of the solid image pick-up element can be further enhanced.

The present invention is applicable to the case where the area of a detection diode provided in an output portion is reduced or the wiring length between the detection diode and a driver gate provided in the output portion at the first stage thereof is shortened to reduce the capacity of the detection portion of the output portion for the increase in electric charge-to-voltage conversion efficiency. In this case also, an opening is preferably formed through dielectric films and above the output portion.

The present invention is also applicable to an interline transfer type CCD solid image pick-up element or a frame transfer type solid image pick-up element.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A solid state image pick-up element comprising:
    a semiconductor substrate;
    a plurality of light receiving portions, formed on said semiconductor substrate, for performing photoelectric conversion with respect to light received thereby;
    a plurality of transfer portions, formed on said semiconductor substrate, for transferring signals obtained through photoelectric conversion;
    an output portion, formed on said semiconductor substrate, for outputting said signals transferred from said transfer portions;
    a first insulating film covered on said light receiving portions, said transfer portions and said output portion;
    a pad portion formed on said first insulating film; and
    a second insulating film covered on said semiconductor substrate over said first insulating film, said second insulating film having openings therethrough formed at locations above said pad portion and said output portion to thereby enhance an electric charge-to-voltage conversion efficiency of said output portion.

2. The solid state image pick-up element according to claim 1, wherein said second insulating film is made of polymeric resin.

3. The solid state image pick-up element according to claim 1, wherein the size and configuration of the opening above said output portion is substantially the same as the size and configuration of an upper surface of said output portion.

4. The solid state image pick-up element according to claim 1, wherein said second insulating film is made of one of silicon nitride and silicon oxide.

5. A solid state image pick-up element comprising:
a semiconductor substrate;
a plurality of light receiving portions, formed on said semiconductor substrate, for performing photoelectric conversion with respect to light received thereby;
a plurality of transfer portions, formed on said semiconductor substrate, for transferring signals obtained through photoelectric conversion;
an output portion, formed on said semiconductor substrate, for outputting said signals transferred from said transfer portions; and
a dielectric film covered on said semiconductor substrate and having an opening formed therethrough at a location above said output portion to thereby enhance an electric charge-to-voltage conversion efficiency of said output portion;
further comprising a first insulating film formed under said dielectric film, another insulating film formed over said dielectric film, and a color filter and a lens assembly formed one upon another on said light receiving portions, wherein said dielectric film is made of silicon nitride, and said opening being also formed through at least one of said first insulating film and said second insulating film.

6. The solid state image pick-up element according to claim 5, wherein the size and configuration of the opening above said output portion is substantially the same as the size and configuration of an upper surface of said output portion.

7. A solid state image pick-up element comprising:
a semiconductor substrate;
a plurality of light receiving portions, formed on said semiconductor substrate, for performing photoelectric conversion with respect to light received thereby;
a plurality of transfer portions, formed on said semiconductor substrate, for transferring signals obtained through photoelectric conversion;
an output portion, formed on said semiconductor substrate, for outputting said signals transferred from said transfer portions; and
at least one dielectric film covered on said semiconductor substrate and having an opening therethrough formed at a location above said output portion to thereby enhance an electric charge-to-voltage conversion efficiency of said output portion;
further comprising an insulating film and a color filter formed one above the other on said light receiving portions, wherein said opening is formed through said insulating film.

8. The solid state image pick-up element according to claim 7, wherein the size and configuration of the opening above said output portion is substantially the same as the size and configuration of an upper surface of said output portion.

9. The solid state image pick-up element according to claim 7, and further comprising a pad portion formed on said semiconductor substrate.

10. A solid state image pick-up element comprising:
a semiconductor substrate;
a plurality of light receiving portions, formed on said semiconductor substrate, for performing photoelectric conversion with respect to light received thereby;
a plurality of transfer portions, formed on said semiconductor substrate, for transferring signals obtained through photoelectric conversion;
an output portion, formed on said semiconductor substrate, for outputting said signals transferred from said transfer portions; and
at least one dielectric film covered on said semiconductor substrate and having an opening therethrough formed at a location above said output portion to thereby enhance an electric charge-to-voltage conversion efficiency of said output portion;
further comprising an insulating film and a lens assembly formed one above the other on said light receiving portions, wherein said opening is formed through said insulating film.

11. The solid state image pick-up element according to claim 10, wherein the size and configuration of the opening above said output portion is substantially the same as the size and configuration of an upper surface of said output portion.

12. The solid state image pick-up element according to claim 10, and further comprising a pad portion formed on said semiconductor substrate.

* * * * *